(12) United States Patent
Chien et al.

(10) Patent No.: US 7,239,199 B1
(45) Date of Patent: Jul. 3, 2007

(54) AMPLIFIER CALIBRATION

(75) Inventors: George Chien, Cupertino, CA (US);
Donghong Cui, San Jose, CA (US);
King Chun Tsai, San Jose, CA (US);
Yungping Hsu, Saratoga, CA (US);
Hsiao-Cheng Tang, Milpitas, CA (US);
Yonghua Song, Saratoga, CA (US)

(73) Assignee: Marvell International Ltd., Hamilton (BM)

( * ) Notice: Subject to any disclaimer, the term of this patent is extended or adjusted under 35 U.S.C. 154(b) by 1 day.

(21) Appl. No.: 10/825,781

(22) Filed: Apr. 16, 2004

Related U.S. Application Data (60) Provisional application No. 60/472,695, filed on May 22, 2003.

(51) Int. Cl.
*H03F 1/02* (2006.01)
(52) U.S. Cl. .......................... 330/9; 330/259
(58) Field of Classification Search ................ 330/259, 330/258, 9, 252; 327/307
See application file for complete search history.

(56) References Cited

U.S. PATENT DOCUMENTS

| | | | |
|---|---|---|---|
| 4,667,166 A * | 5/1987 | Itoh | 330/260 |
| 6,194,941 B1 | 2/2001 | Zarabadi et al. | |
| 6,420,932 B1 * | 7/2002 | Casper | 330/258 |
| 6,504,498 B1 | 1/2003 | O'Brien | |
| 6,516,185 B1 | 2/2003 | MacNally | |
| 6,535,561 B2 | 3/2003 | Boesch et al. | |

| | | |
|---|---|---|
| 2003/0112049 A1 | 6/2003 | Wang |

FOREIGN PATENT DOCUMENTS

| | | |
|---|---|---|
| EP | 01033852 | 9/2000 |
| WO | WO 02/071604 A2 * | 12/2002 |

OTHER PUBLICATIONS

"Part 16: Air Interface For Fixed Broadband Wireless Access Systems", IEEE 802.16, IEEE Standard For Local And Metropolitan Area Networks, Oct. 1, 2004.
"802.16 IEEE Standard for Local and Metropolitan Area Networks; Part 16: Air Interface for Fixed Broadband Wireless Access Systems," 802.16 IEEE Standard for Local and Metropolitan Area Networks, Oct. 1, 2004, pp. i-xxxiv and pp. 1-857, IEEE Std 802.16-2004, IEEE, United States.
802.11 IEEE - Information Technology - Telecommunications and information exchange between systems - Local and metropolitan area networks - Specific requirements Part II wireless LAN Medium Access Control (MAC) and Physical Layer (PHY) specifications Aug. 20, 1999 ISO/IEC 8802-11:1999.

(Continued)

*Primary Examiner*—Henry Choe (57) ABSTRACT

Apparatus, systems, and methods implementing techniques for reducing the variation of a DC offset are described. An input signal is amplified to produce an intermediate signal. The intermediate signal is processed to produce a feedback signal and an output signal, where the output signal has a DC offset that varies with a varying parameter of the circuitry used to process the intermediate signal. Variation of the DC offset of the output signal is reduced using the feedback signal. In one implementation, the circuitry used to process the intermediate signal is a variable-gain amplifier circuit, and the DC offset of the output signal varies with a gain of the variable-gain amplifier.

40 Claims, 6 Drawing Sheets

OTHER PUBLICATIONS 802.11a IEEE Supplement to IEEE Standard for Information Technology-Telecommunications and information exchange between systems - Local and metropolitan area networks - Specific requirements Part II: "Wireless LAN Medium Access Control (MAC) and Physical Layer (PHY) specifications: High-Speed Physical Layer in the 5 GHZ Band" LAN/MAN Standards Committee of the IEEE Computer Society Approved Sep. 16, 1999.

802.11b Supplement to IEEE Standard for Information Technology-Telecommunications and information exchange between systems - Local and metropolitan area networks - Specific requirements Part II: "Wireless LAN Medium Access Control (MAC) and Physical Layer (PHY) specifications: Higher-Speed Physical Layer Extension in the 2.4 GHz Band" LAN/MAN Standards Committee of the IEEE Computer Society Approved Sep. 16, 1999.

802.11e IEEE Standard for Information Technology - Telecommunications and information exchange between systems - Local and metropolitan area networks - Specific requirements Part II wireless LAN Medium Access Control (MAC) and Physical Layer (PHY) specifications: "Amendment: Medium Access Control (MAC) Quality of Service (QoS) Enhancements" LAN/MAN Committee of the IEEE Computer Society, 2004.

802.11h IEEE Standard Information Technology - Telecommunications and information exchange between systems - Local and metropolitan area networks - Specific requirements Part II Wireless LAN Medium Access Control (MAC) and Physical Layer (PHY) specifications: "Amendment 5: Spectrum and Transmit Power Management Extensions in the 5 GHz band in Europe" IEEE Computer Society Oct. 14, 2003.

802.11i IEEE Standard Information Technology - Telecommunications and information exchange between systems - Local and metropolitan area networks - Specific requirements Part II Wireless LAN Medium Access Control (MAC) and Physical Layer (PHY) specifications: "Amendment 6: Medium Access Control (MAC) Security Enhancements" IEEE Computer Society Jul. 23, 2004.

802.11g Draft Supplement to Standard [for] Information Technology Telecommunications and information exchange between systems - Local and metropolitan area networks - Specific requirements Part II Wireless LAN Medium Access Control (MAC) and Physical Layer (PHY) specifications: "Further Higher Data Rate Extension in the 2.4 GHz Band" IEEE Apr. 2003.

802.11n (draft) IEEE P802.11 Wireless LANs TGn Sync Proposal Technical Specification Abstract May 2005.

* cited by examiner

AMPLIFIER CALIBRATION

CROSS-REFERENCE TO RELATED APPLICATIONS

The present application claims priority to commonly assigned U.S. Provisional Patent Application No. 60/472,695, filed on May 22, 2003, which is incorporated herein by reference in its entirety.

BACKGROUND

The following disclosure relates to electrical circuits and signal processing.

A receiver in a communications system (hereafter referred to as a receiver) is typically designed to receive signals of varying strength. A wireless receiver (e.g., an IEEE 802.11, 802.11a, 802.11b, 802.11e, 802.11g, 802.11h, 802.11i, 802.11n, and/or 802.16 compliant receiver), for example, can receive weak signals from transmitters that are far away from the wireless receiver or strong signals from transmitters that are close to the wireless receiver. To adjust for differing signal strengths, a conventional wireless receiver uses one or more gain stages to amplify or attenuate the received signal. In a conventional wireless receiver that mixes the received signal down to an intermediate frequency (IF) signal and later mixes the IF signal down to a baseband signal, both the gain of the IF signal and the gain of the baseband signal typically are adjusted.

Direct-current (DC) offset voltages can be generated in many of the circuits in a receiver. DC offset voltages can be amplified in gain stages along with the received signal if the design of the receiver allows the DC offset voltages to enter the gain stages. When two circuits are coupled using alternating-current (AC) coupling (e.g., by using a series capacitor to connect the output of one circuit to the input of the other circuit), low-frequency signal components, including any DC offset voltage, are heavily attenuated.

The amplifiers in an IF gain stage of a wireless receiver can be AC coupled to one another because the IF signal does not include any low-frequency signal components of interest. The amplifiers in a baseband gain stage, however, are typically direct-current (DC) coupled, because the baseband signal can have low-frequency signal components of interest. A DC offset voltage generated by a circuit early in a DC-coupled baseband region of the wireless receiver will be amplified in the baseband gain stage. Conventional baseband gain stages can supply over 45 dB of gain, so a DC offset voltage can be amplified by a factor of 200 or more. The large amplification of a DC offset voltage can cause amplifiers in the baseband gain stage to run out of voltage range for a given supply voltage, hence distorting the received signal.

Both wireless receivers and wireline receivers (e.g., gigabit Ethernet or fiber-channel receivers) typically have DC-coupled baseband gain stages in which important signal filtering and amplification is performed. DC offset voltages are often present in baseband circuits because of, for example, input device mismatch, current source mismatch, or load mismatch. In some conventional receiver designs, a highpass filter is added to the baseband gain stage to filter out any DC offset voltage. High-order highpass filters are typically used so that as little as possible of the received signal is filtered out.

When a highpass filter is used to remove a DC offset from a signal, several problems can arise. One problem occurs when the frequency of an oscillator in a wireless receiver differs slightly from the frequency that a wireless transmitter oscillator provides. When the oscillator signal generated by the oscillator in the wireless receiver is used to mix a received signal down to baseband, the frequency difference between the transmitter and receiver oscillators will cause the frequency components of the baseband signal to be shifted, resulting in a frequency-shifted baseband signal. When a frequency-shifted baseband signal is filtered with the highpass filter, desirable frequency components may be attenuated. The attenuation of frequency components when there is a frequency difference between the transmitter and receiver oscillators can cause signal distortion and degrade the quality of the received signal. High-order filters typically must be used to minimize the amount of signal distortion and quality degradation.

Additionally, if a highpass filter is used to remove a DC offset in the baseband gain stage, the corner frequency of the highpass filter typically depends on the gain setting of the baseband gain stage. If the corner frequency depends on the gain setting, the frequency components that are attenuated in the received signal will vary as a function of received signal power. Variation in the frequency components that are attenuated is typically an undesirable characteristic for a wireless receiver. In addition, a tradeoff typically exists between how high the corner frequency is and the speed at which the received signal can be filtered. Faster filtering requires attenuating more of the received signal.

For certain communications standards, a baseband signal near DC is important, so highpass filtering of the signal is not ideal. For example, highpass filtering of the received signal can cause DC-wandering problems, where the receiver loses a reference that was provided by the DC component in the received signal.

For certain wireless communications standards, a low-IF wireless receiver can mix the desired signal to a low intermediate frequency instead of to baseband. In this situation, if other problems associated with low-IF receivers are resolved, the DC-offset problem can be alleviated because the signal can be processed without the DC component. However, this only works well for some communications standards. High-bandwidth standards, for example, can be difficult to implement using a low-IF wireless receiver because high-order filters typically are required to isolate channels in the received signal. Care must also be taken with low-IF wireless receivers to avoid image-folding problems.

Figure 1:
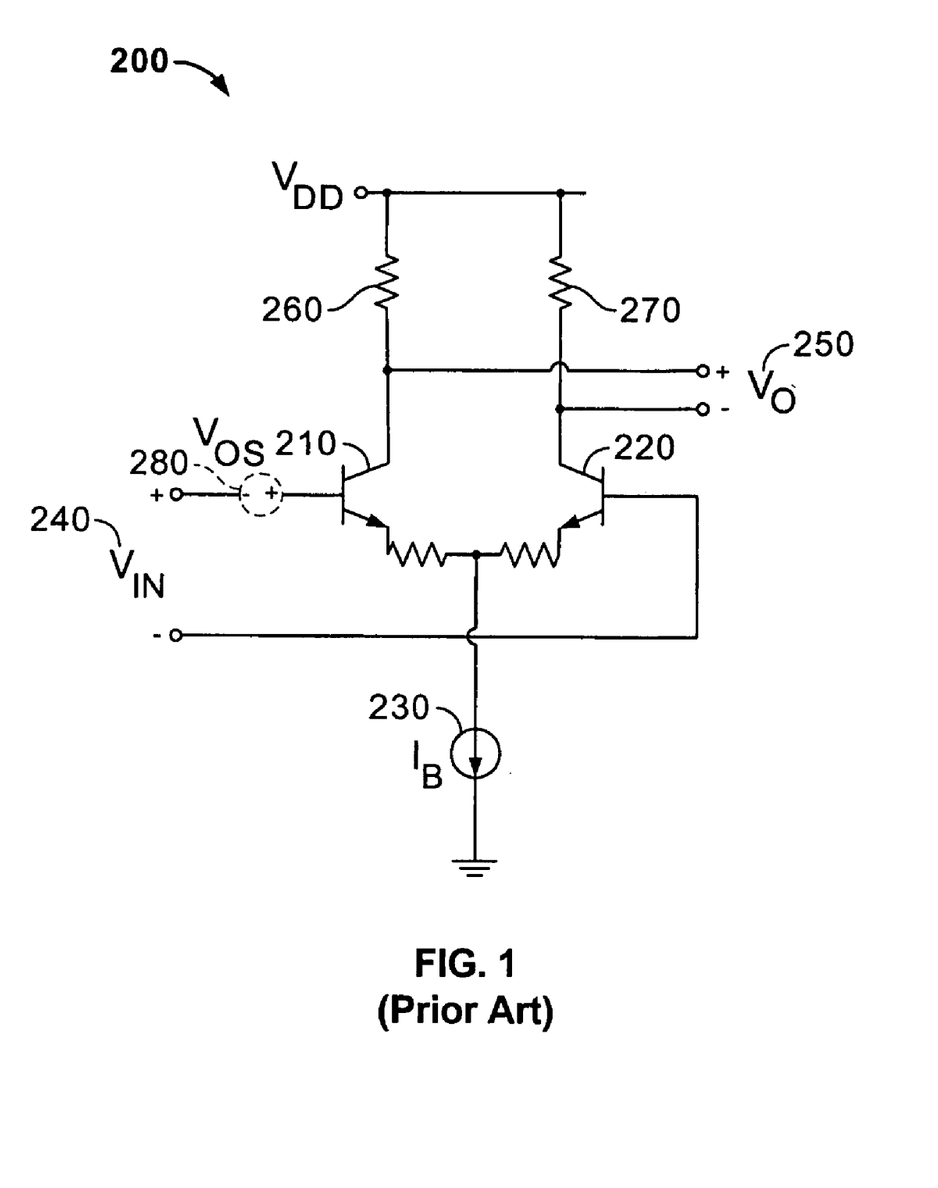
FIG. 1 is a schematic of a differential amplifier circuit.

FIG. 1 shows a conventional differential amplifier 200. A first transistor 210 and a second transistor 220 are biased into the active region by a biasing current 230. A differential input signal 240 is applied between the base of first transistor 210 and the base of second transistor 220. A differential output signal 250 is present between the collector of first transistor 210 and the collector of second transistor 220.

If first transistor 210 and second transistor 220 are perfectly matched transistors, a first resistor 260 and a second resistor 270 are perfectly matched resistors, and there is no DC component in differential input signal 240, there will be no DC component in differential output signal 250. If, however, first transistor 210 and second transistor 220 are not perfectly matched transistors, or if first resistor 260 and second resistor 270 are not perfectly matched resistors, a DC component will be present in differential output signal 250 when there is no DC component in differential input signal 240.

DC components generated by component mismatches anywhere in differential amplifier 200 have the same effect on differential output signal 250 as a properly chosen representative DC offset voltage 280 has on differential output signal 250 when the components of differential amplifier 200 are perfectly matched. All DC offsets generated in differential amplifier 200 can be represented by DC offset voltage 280. For example, a DC component in differential output signal 250 due to a mismatch between first transistor 210 and second transistor 220 can be modeled as being caused by representative DC offset voltage 280 applied to the base of first transistor 210 with first transistor 210 and second transistor 220 being perfectly matched. Likewise, a DC component in differential output signal 250 due to a mismatch between first resistor 260 and second resistor 270 can be modeled as being caused by representative DC offset voltage 280 applied to the base of first transistor 210 with first resistor 260 and second resistor 270 being perfectly matched.

SUMMARY

In one aspect, the invention features a circuit that includes an amplifier that receives an input signal and a feedback signal and produces an intermediate signal. A variable-offset circuit receives the intermediate signal and produces an output signal and the feedback signal, where the output signal has a DC offset that varies with a varying parameter of the variable-offset circuit. The amplifier reduces the variation of the DC offset of the output signal.

In another aspect, the invention features a circuit that includes an amplifying means that receives an input signal and a feedback signal and produces an intermediate signal. A processing means receives the intermediate signal and produces an output signal and the feedback signal, where the output signal has a DC offset that varies with a varying parameter of the processing means. The amplifying means reduces variation of the DC offset of the output signal.

In one aspect, the invention features a wireless transceiver that includes a receiver, which receives a modulated carrier signal. The receiver includes an amplifier that receives an input signal and a feedback signal and produces an intermediate signal. The receiver also includes a variable-offset circuit that receives the intermediate signal and produces an output signal and the feedback signal, where the output signal has a DC offset that varies with a varying parameter of the variable-offset circuit. The amplifier reduces variation of the DC offset of the output signal.

In another aspect, the invention features a wireless transceiver that includes a receiver means, which receives a modulated carrier signal. The receiver means includes an amplifying means that receives an input signal and a feedback signal and produces an intermediate signal. The receiver means also includes a processing means that receives the intermediate signal and produces an output signal and the feedback signal, where the output signal has a DC offset that varies with a varying parameter of the processing means. The amplifying means reduces the variation of the DC offset of the output signal.

In yet another aspect, the invention features a method for reducing the variation of a DC offset. An input signal is amplified to produce an intermediate signal. The intermediate signal is processed to produce a feedback signal and an output signal, where the output signal has a DC offset that varies with a varying parameter of circuitry used to process the intermediate signal. Variation of the DC offset of the output signal is reduced using the feedback signal.

Particular implementations may include one or more of the following features. The circuit can include a correction circuit that receives the output signal and produces a correction signal, which is applied to the variable-offset circuit to reduce a magnitude of the DC offset of the output signal. The correction circuit can include a digital signal processor that measures the DC offset of the output signal and produces a control signal. The correction circuit can also include a digital-to-analog converter that receives the control signal and produces the correction signal. The correction signal can be a current that is applied to the variable-offset circuit. The correction signal can be a voltage that is applied to the variable-offset circuit.

The variable-offset circuit can be a variable-gain amplifier circuit, and the DC offset of the output signal can vary with a gain of the variable-gain amplifier. The amplifier can be a unity-gain buffer amplifier. The circuit can be compliant with one or more of the Institute of Electrical and Electronics Engineers standards 802.11, 802.11a, 802.11b, 802.11e, 802.11g, 802.11h, 802.11i, 802.11n, and 802.16.

Implementations can include one or more of the following advantages. A method, apparatus, and system are disclosed that can be used to decrease offsets in a circuit. Near-DC frequency components in a received signal can be preserved. A digital signal processor can be used to monitor offsets in a continuous fashion and can greatly simplify the acquisition of an initial offset and the tracking of an offset drift while in operation. The amount of filtering and the amount of signal distortion can be well controlled and can be adjusted dynamically. The dependence of DC offsets on the gain of an amplifier can be reduced, and the linearity of the amplifier can be increased. DC offsets can be reduced in receivers for communications standards for which conventional receiver architectures are susceptible to DC offsets.

These general and specific aspects may be implemented using an apparatus, a system, a method, or any combination of apparatus, systems, and methods.

The details of one or more implementations are set forth in the accompanying drawings and the description below.

Other features and advantages will become apparent from the description, the drawings, and the claims.

BRIEF DESCRIPTION OF THE DRAWINGS

Like reference numbers and designations in the various drawings indicate like elements.

DETAILED DESCRIPTION

Figure 2:
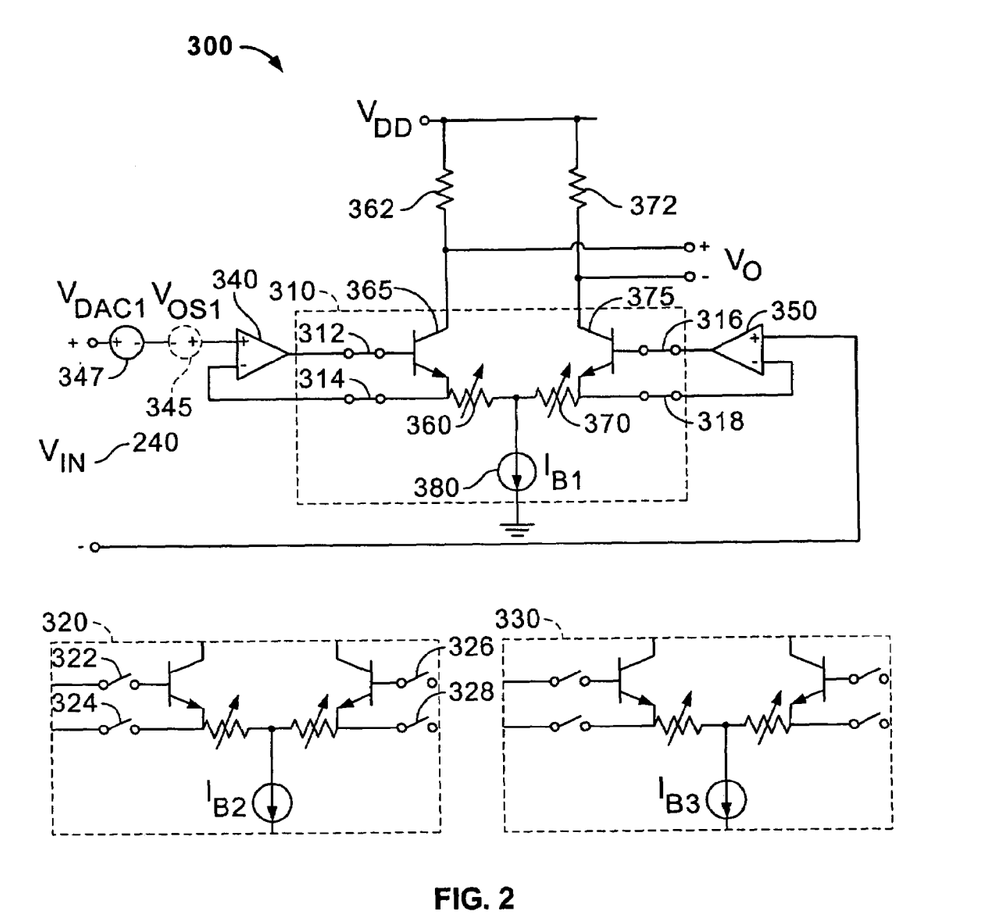
FIG. 2 is a schematic of a variable-gain amplifier with multiple transconductance stages.

FIG. 2 shows a schematic of a variable-gain amplifier 300. Variable-gain amplifier 300 has three transconductance stages (stage 310, stage 320, and stage 330) that provide different amounts of gain to differential input signal 240. The dotted boxes around stage 320 and stage 330 indicate that stage 320 and stage 330 can be used in variable-gain amplifier 300 in the same way that stage 310 is, though only one stage is used at a time. The gain of each of stage 310, stage 320, and stage 330 can be adjusted over a range, for example, by varying the resistance of the resistors that are connected to the transistor emitters (e.g., resistor 360 and resistor 370 in stage 310). For example, referring to stage 310, the products of the transconductances of transistors 365 and 375 with the resistances of resistors 360 and 370 can be much greater than 1 (e.g., $Gm_{365}*R_{360}>>1$ and $Gm_{375}*R_{370}>>1$). When the products are much greater than 1, the gain of variable-gain amplifier 300 primarily depends on the ratio of the resistances of resistors 362 and 372 to the resistances of resistors 360 and 370 (e.g., $R_{362}/R_{360}$ and $R_{372}/R_{370}$).

Gains outside of the range over which a stage can be adjusted can be achieved by using another stage in the variable-gain amplifier 300. For example, if stage 320 has a higher maximum gain than stage 310, and a higher gain is required than stage 310 can provide, stage 310 can be powered down and disconnected from the input signal path of variable-gain amplifier 300 using a relay (represented by switches 312, 314, 316, and 318). Stage 320 can be powered up and connected to the input signal path of variable-gain amplifier 300 using a relay (represented by switches 322, 324, 326, and 328). Stage 310, stage 320, and stage 330 can provide differing ranges of gain by using differing bias currents (e.g., bias current 380 in stage 310) and differing values of resistance (e.g., resistor 360 and resistor 370 in stage 310).

As is shown in FIG. 2, an input signal Vin 240 is applied to one input of amplifier 340 (350). The second input to amplifier 340 (350) is a feedback signal that is produced from the output of the emitter of transistor 365 (375) of a first stage of the variable gain amplifier. Similarly, outputs from other corresponding emitters in the other stages can as well be coupled to the second input of amplifier 340 (350) as is shown in the inset detail associated with the respective stages shown in FIG. 2.

As can be seen in FIG. 2, the output of amplifier 340 produces a signal (i.e., an intermediate signal), that is provided as an input to the base of transistor 365 (375) (and similarly to the bases of transistors in other stages as shown in the inset). The gain stage 310 has a variable offset, as described above, whose effect is decreased by the use of the amplifier 340 (350). Accordingly, the gain stage 310 as configured can be referred to as a variable offset circuit. The gain stage 310 includes transistor 365 (375) that receive the signal produced by the amplifier 340 (350) (the intermediate signal) and produce a feedback signal that is provided as an input to amplifier 340 (350).

Each of stages 310, 320, and 330 can have an associated DC offset voltage that is, for example, caused by component mismatch in the respective stage. The DC offset voltage in each stage may be different, depending on the mismatch of the components in the stage. Hereafter, the transconductance stage that is connected to variable-gain amplifier 300 (e.g., stage 310, stage 320, or stage 330) will be referred to as the connected stage. The DC offset voltage of the connected stage can be represented by including the DC offset voltage of the connected stage in an input-referred representative DC offset voltage 345. DC offset voltage 345 represents DC offset voltages that occur in various parts of variable-gain amplifier 300. Because the DC offset voltage of each transconductance stage can be different and representative DC offset voltage 345 depends on which stage is connected to variable-gain amplifier 300, a DC offset voltage at the output of variable-gain amplifier 300 is gain dependent.

The gain-dependent DC offset voltage at the output of variable-gain amplifier 300 can be transformed into a substantially gain-independent DC offset voltage by adding amplifiers 340 and 350 between differential input signal 240 and the transistors in stages 310, 320, and 330. In one implementation, only amplifier 340 is used. The DC offsets of amplifier 340 and amplifier 350 can be input referred and included in representative DC offset voltage 345. When a DC offset in a circuit is input referred, the DC offset is modeled by a DC source (e.g., representative DC offset voltage 345) at the input of the circuit that, if the circuit were ideal and had no DC offset, would create a DC offset in the output of the ideal circuit that was equivalent to the DC offset in the output of the non-ideal circuit caused by the actual DC offset in the non-ideal circuit. The feedback configuration of amplifiers 340 and 350 causes amplifiers 340 and 350 to act as buffers with unity gain. When amplifiers 340 and 350 are used, the gain of variable-gain amplifier 300 primarily depends on the ratio of the resistances of resistors 362 and 372 to the resistances of resistors 360 and 370 (e.g., $R_{362}/R_{360}$ and $R_{372}/R_{370}$) over a wider range of gains than when amplifiers 340 and 350 are not used. Amplifiers 340 and 350 decrease the effect that the DC offset of the connected stage has on the output signal. The DC offset in the output signal due to the DC offset in the connected stage is decreased by a factor that corresponds to the open-loop gain of amplifiers 340 and 350.

For example, if variable-gain amplifier 300 amplified differential input signal 240 by a factor of 100 without using amplifiers 340 and 350 (e.g., input signal 240 were applied directly to the bases of the transistors in stage 310, stage 320, or stage 330), the DC offset voltage of the connected stage would be amplified by a factor of 100 in the output signal. In this example, if amplifiers 340 and 350 were used in variable-gain amplifier 300 and amplifiers 340 and 350 both had an open-loop gain of 50, the effect of the DC offset of the connected stage would be reduced by a factor of 50 in the output signal. In this example, the DC offset of the connected stage would only be amplified by a factor of 2 in the output signal instead of being amplified by a factor of 100. The DC offset voltages of amplifiers 340 and 350 are included in representative DC offset voltage 345 and dominate representative DC offset voltage 345. Because the DC offset voltages of amplifiers 340 and 350 do not vary with the gain of variable-gain amplifier 300, and because the effect of the DC offset of the connected stage is reduced by amplifiers 340 and 350, the DC offset at the output of variable-gain amplifier 300 is substantially gain-independent. The addition of amplifiers 340 and 350 improves the linearity of variable-gain amplifier 300 and decreases the sensitivity of variable-gain amplifier 300 to process variations and temperature fluctuations.

Figure 3A:
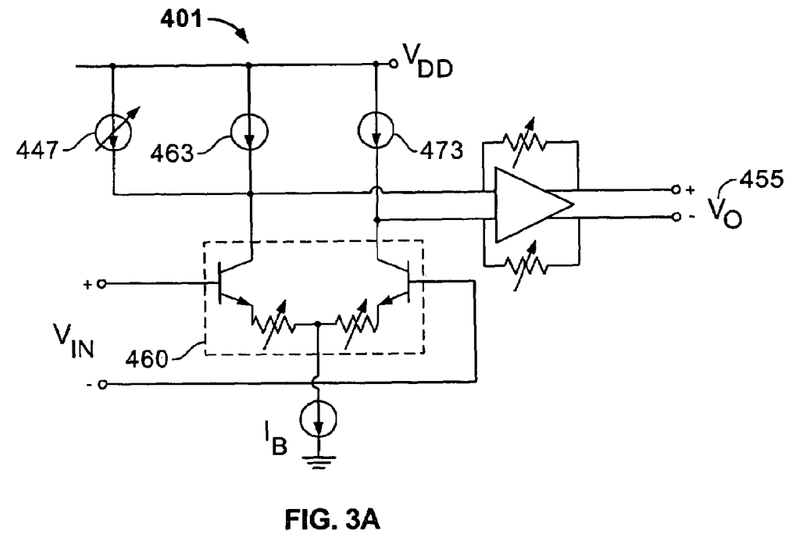
FIG. 3A is a schematic of a differential amplifier circuit including a correction current.

Referring to FIG. 3A, a circuit 401 includes current sources 463 and 473 that drive a transconductance stage 460. If the currents provided by current sources 463 and 473 are not identical, a DC offset may be produced in output signal 455 that does not vary as the gain of transconductance stage 460 varies. The gain-independent DC offset caused by the mismatch of current sources 463 and 473 can be reduced by injecting a correction current 447 into circuit 401.

Figure 3B:
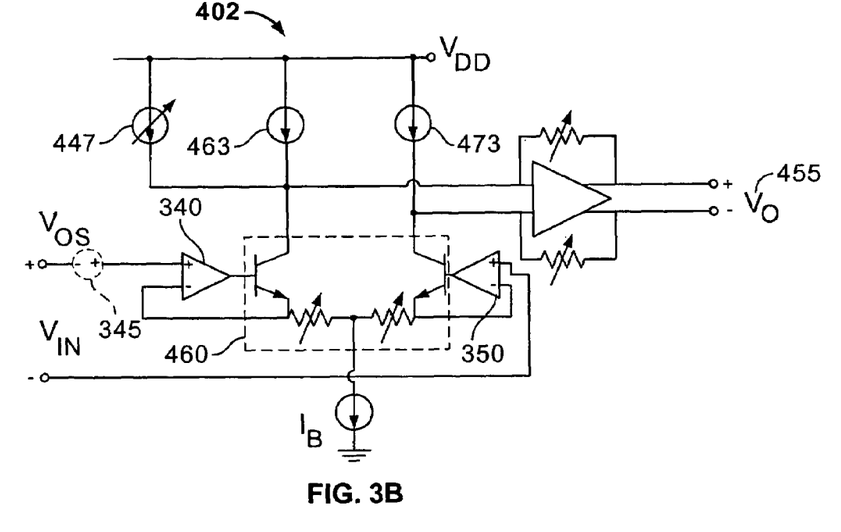
FIG. 3B is a schematic of a differential amplifier circuit including a correction current.

The technique discussed in the context of FIG. 3A to reduce a gain-independent DC offset can be combined with the technique discussed in the context of FIG. 2 to make a gain-dependent offset substantially gain-independent. The combination of the two techniques produces a circuit 402 shown in FIG. 3B. Circuit 402 combines the benefits of variable-gain amplifier 300 (FIG. 2) with the benefits of circuit 401 (FIG. 3A) to reduce gain-dependent and gain-independent DC offsets.

Figure 4A:
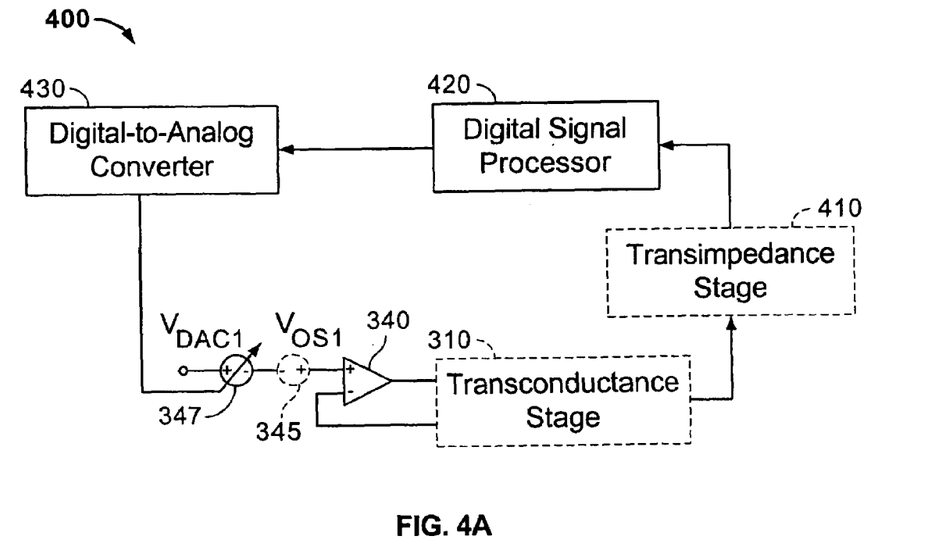
FIG. 4A is an amplifier calibration circuit for reducing a DC offset in an amplifier.

FIG. 4A shows how a circuit 400 can be used to reduce a DC offset voltage in a variable-gain amplifier. When a DC offset is reduced, the magnitude of the DC offset is made smaller. DC offsets may be positive or negative. In addition, a signal may have a DC component (either positive or negative) that the DC offset is combined with. Reducing a DC offset does not necessarily mean that the DC component of the resulting signal will be zero, nor does reducing a DC offset necessarily mean that the voltage of the DC component of the resulting signal will become less positive (more negative). For example, reducing a negative DC offset in a signal with a positive DC component will make the DC component of the resulting signal more positive. Digital signal processor (DSP) 420 measures the DC offset at the output of transimpedance stage 410 and provides a control signal to digital-to-analog converter (DAC) 430. Based on the control signal, DAC 430 generates correction voltage 347. DSP 420 changes the control signal until there is a predetermined amount of DC offset (in one implementation, as little DC offset as possible) at the output of transimpedance stage 410. The granularity of correction voltage 347 is determined by the resolution of DAC 430. There is no DC offset at the output of transimpedance stage 410 when correction voltage 347 exactly cancels representative DC offset voltage 345.

Figure 4B:
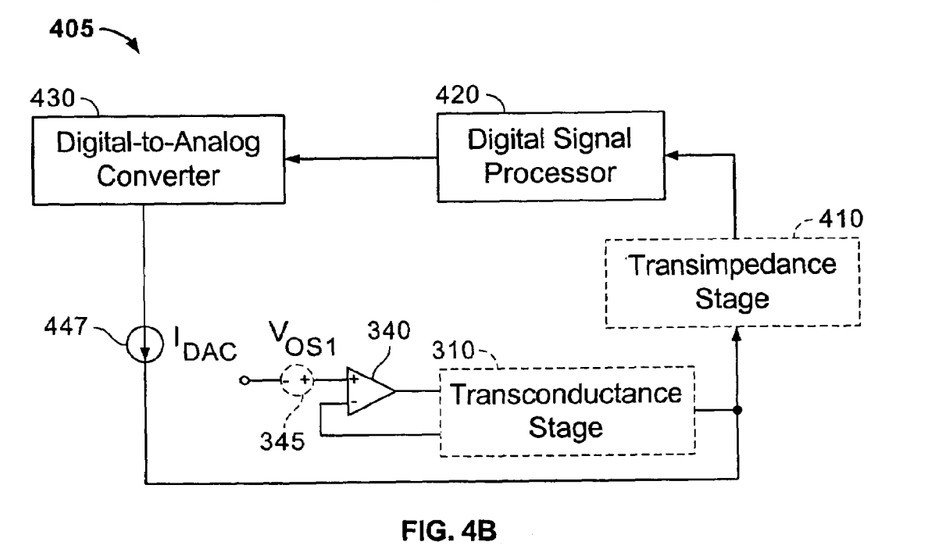
FIG. 4B is an amplifier calibration circuit for reducing a DC offset in an amplifier.

As described above, a DC offset voltage can be corrected by using a correction voltage. The DC offset voltage alternatively can be corrected by applying a correction current to an appropriate node in the circuit. FIG. 4B shows a circuit 405 similar to circuit 400 of FIG. 4A, with correction voltage 347 replaced by correction current 447.

Figure 5:
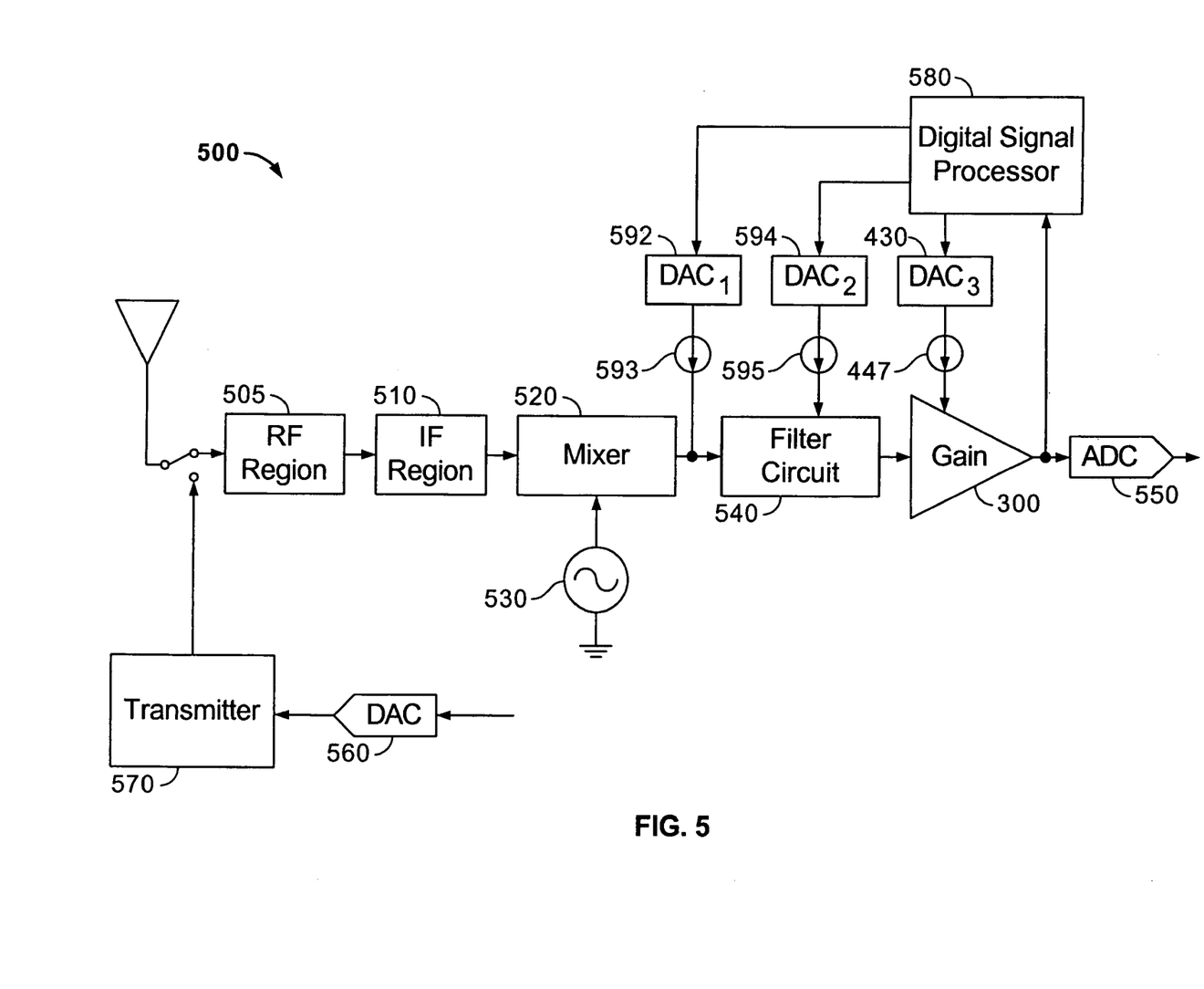
FIG. 5 is a block diagram of a wireless transceiver.

FIG. 4A and FIG. 4B show methods and circuits for reducing DC offset voltages in a variable-gain amplifier. These techniques can be used in a number of applications, for example, in an amplifier calibration circuit. Referring to FIG. 5, an amplifier calibration circuit is shown for use in a wireless transceiver 500 (hereafter referred to as transceiver 500). The receive path of transceiver 500 includes a radio-frequency (RF) region 505 where a received modulated RF signal can be filtered to attenuate out-of-band signals. In intermediate-frequency (IF) region 510, the RF signal is mixed down to a lower frequency to create an IF signal. A mixer 520 modulates the IF signal with a signal generated by oscillator 530 to create a baseband signal. The baseband signal is-filtered by filter circuit 540 to attenuate undesired frequencies in the baseband signal. The filtered baseband signal is then amplified by variable-gain amplifier 300 and is converted into a digital signal by an analog-to-digital converter 550. The transmit path of transceiver 500 includes digital-to-analog converter (DAC) 560 and a transmitter 570.

The baseband region of the receiver portion of transceiver 500 begins at the output of mixer 520 and extends to the input of ADC 550. The baseband region can be calibrated to decrease DC offsets by using digital signal processor (DSP) 580, DAC 592, DAC 594, and DAC 430. In the following discussion, DSP 580 measures the DC offset of the signal at the output of variable-gain amplifier 300, and the DC offset is decreased by injecting currents into the baseband region. Voltages can alternatively be applied in appropriate places in the baseband region to decrease the DC offset. DAC 592 provides coarse adjustment of the DC offset at the start of the baseband region. DAC 592 reduces the DC offset by applying a correction current 593 at the input of filter circuit 540. DAC 594 provides fine adjustment of the DC offset by applying correction current 595 between filtering stages in filter circuit 540.

In one implementation, the resolution of DAC 594 is finer than the resolution of DAC 592 so that a more precise correction current 595 can be applied to filter circuit 540 to make a fine adjustment to the DC offset. In one implementation, DAC 592 and DAC 594 are both 8-bit DACS, and the three least significant bits of DAC 592 overlap the range of the three most significant bits of DAC 594 so that correction current 595 can be adjusted frequently to minimize the DC offset without adjusting correction current 593.

Because DAC 592 and DAC 594 can be separate circuits, the amount of correction current 593 controlled by the three least significant bits of DAC 592 may not correspond exactly to the amount of correction current 595 controlled by the three most significant bits of DAC 594. The overlap between DAC 592 and DAC 594 assures that there is not a gap between the range of correction current 593 and the range of correction current 595. Because of the fine resolution of DAC 594, correction current 595 can correct the DC offset in small steps, yielding a DC offset of close to zero. In one implementation, DAC 592 and DAC 594 are implemented using a single circuit. DAC 430 injects correction current 447 into variable-gain amplifier 300 as was described in the context of FIG. 2, FIG. 3A, FIG. 3B, FIG. 4A and FIG. 4B.

Figure 6:
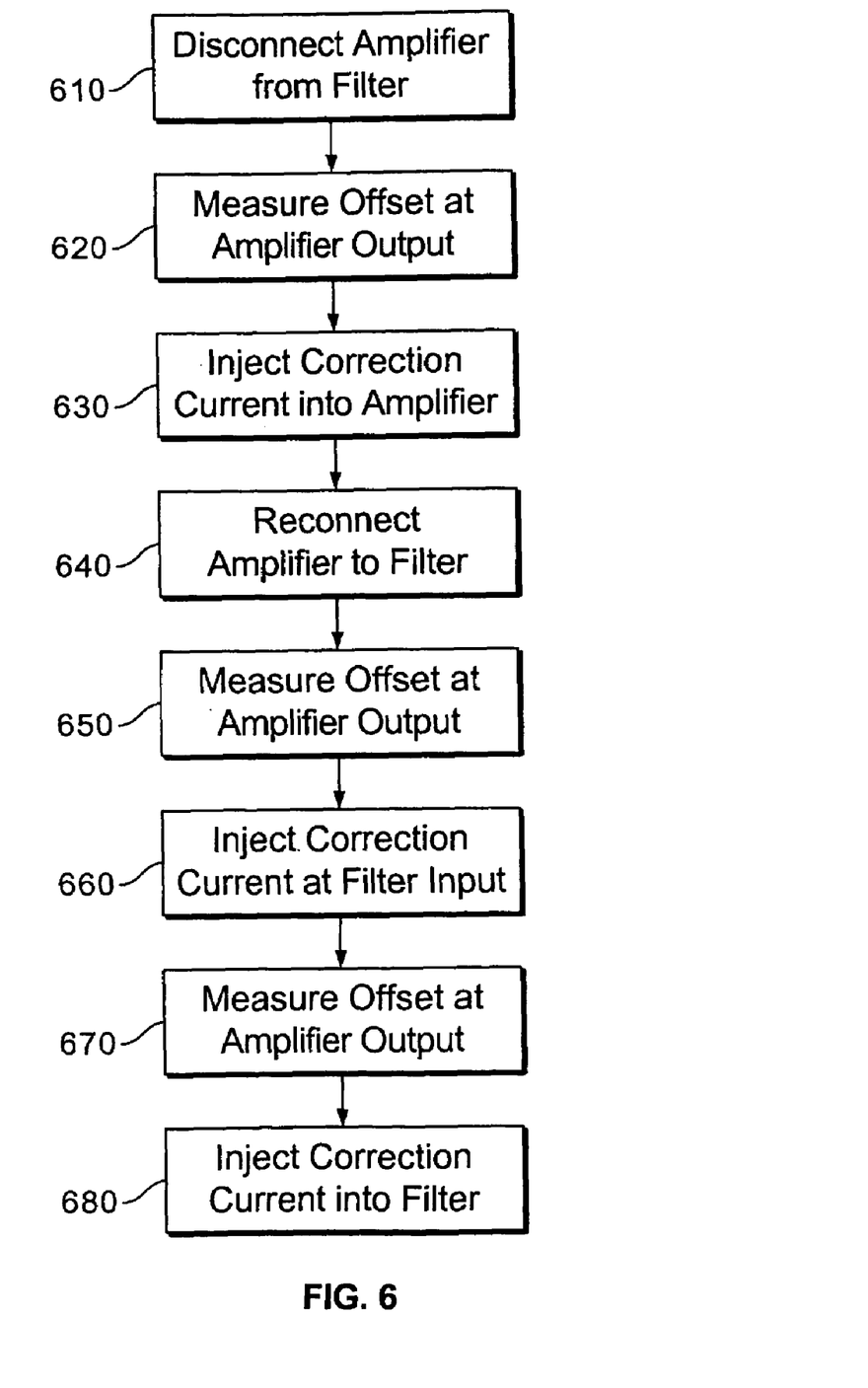
FIG. 6 is a flowchart of a process for calibrating a wireless transceiver.

Referring to FIG. 5 and FIG. 6, when transceiver 500 is initialized (e.g., when transceiver 500 is turned on or reset), the DC offset in the baseband region is reduced in three steps. First, the input of variable-gain amplifier 300 is disconnected from filter circuit 540 so that the DC offset from filter circuit 540 (if any) is not present at the input to variable-gain amplifier 300 (step 610). DSP 580 measures the DC offset at the output of variable-gain amplifier 300 (step 620), and sends a control signal to DAC 430 to reduce the DC offset. DAC 430 differentially injects correction current 447 into variable-gain amplifier 300 (step 630). When the DC offset at the output of variable-gain amplifier 300 is sufficiently small, variable-gain amplifier 300 is reconnected to filter circuit 540 (step 640). Second, DSP 580 again measures the DC offset at the output of variable-gain amplifier 300 (step 650) and sends a control signal to DAC 592 to reduce the DC offset. DAC 592 injects correction current 593 at the input of filter circuit 540 to reduce the DC offset (step 660). Third, DSP 580 once more measures the DC offset at the output of variable-gain amplifier 300 (step 670). DSP 580 sends a control signal to DAC 594 to reduce the DC offset. DAC 594 injects correction current 595 between filtering stages in filter circuit 540 to reduce the DC offset (step 680).

The DC offsets in transceiver 500 can fluctuate as the device operates because of temperature variations, magnetic field fluctuations, and for other reasons. DSP 580 continuously monitors the DC offset at the output of variable-gain amplifier 300 during the operation of transceiver 500. Correction current 595 is adjusted continuously to keep the DC offset at the output of variable-gain amplifier 300 small. In one implementation, if DAC 594 is adjusted to a boundary of the range of DAC 594 (e.g., all bits are 1 or all bits are 0), DSP 580 triggers a recalibration of all three DACs—DAC 592, DAC 594, and DAC 430 (e.g., using the method of FIG. 6). The recalibration can be completed between timeslots in the received signal so that no information in the received signal is lost. Alternatively, when DAC 594 is adjusted to a boundary of the range of DAC 594, DAC 594 can overflow into DAC 592, meaning that one or more bits in DAC 592 are changed so that DAC 594 can be adjusted to be back in the range of DAC 594.

Transceiver 500 can be IEEE 802 compliant with the following standards: 802.11, 802.11a, 802.11b, 802.11e, 802.11g, 802.11h, 802.11i, and 802.16.

In one implementation, offsets are corrected by applying correction voltages to the circuit. Correction currents or a combination of correction voltages and correction currents can also be used to correct offsets.

In another implementation, a means for monitoring offsets and generating control signals other than a digital signal processor can be used. For example, a programmable logic circuit or application-specific integrated circuit can be used to monitor the offsets in the circuit and generate control signals. In another implementation, an offset monitoring chip is provided that includes a digital-to-analog converter, so no control signal is explicitly generated.

In one implementation, a means other than a conventional digital-to-analog converter can be used to correct an offset. For example, a digital control signal from a digital signal processor can switch fixed voltage sources into the circuit to correct the offset.

In another implementation, monitoring and correction of the offsets is performed by analog components, so no digital components are required.

The described amplifier that converts gain-dependent offsets to substantially gain-independent offsets can be used before many types of circuits, not just variable-gain amplifiers. For example, the described amplifier can be used in front of a filter that has multiple configurations to make a configuration-dependant offset substantially configuration-independent.

Various implementations have been described. These and other implementations are within the scope of the following claims. For example, the circuit elements described above can be arranged in a different order and still achieve desirable results.

What is claimed is:

1. A circuit, comprising:
an amplifier operable to receive an input signal and a feedback signal and produce an intermediate signal; and
a variable-offset circuit operable to receive the intermediate signal and produce an output signal and the feedback signal, the output signal having a DC offset that varies corresponding to a varying parameter of the variable-offset circuit, the amplifier being operable to reduce variation of the DC offset of the output signal by a factor that corresponds to a gain of the amplifier.

2. A circuit, comprising:
an amplifier operable to receive an input signal and a feedback signal and produce an intermediate signal;
a variable-offset circuit operable to receive the intermediate signal and produce an output signal and the feedback signal, the output signal having a DC offset that varies corresponding to a varying parameter of the variable-offset circuit, the amplifier being operable to reduce variation of the DC offset of the output signal; and
a correction circuit operable to receive the output signal and produce a correction signal, the correction signal being applied to the variable-offset circuit to reduce a magnitude of the DC offset of the output signal.

3. The circuit of claim 2, wherein: the correction circuit includes, a digital signal processor operable to measure the DC offset of the output signal and produce a control signal; and
a digital-to-analog converter operable to receive the control signal and produce the correction signal.

4. The circuit of claim 2, wherein:
the correction signal is a current that is applied to the variable-offset circuit.

5. The circuit of claim 2, wherein:
the correction signal is a voltage that is applied to the variable-offset circuit.

6. The circuit of claim 1, wherein:
the variable-offset circuit is a variable-gain amplifier circuit and the DC offset of the output signal varies with a gain of the variable-gain amplifier.

7. A circuit, comprising:
an amplifier operable to receive an input signal and a feedback signal and produce an intermediate signal; and
a variable-offset circuit operable to receive the intermediate signal and produce an output signal and the feedback signal, the output signal having a DC offset that varies corresponding to a varying parameter of the variable-offset circuit, the amplifier being operable to reduce variation of the DC offset of the output signal; where
the amplifier is a unity-gain buffer amplifier.

8. A circuit, comprising:
an amplifier operable to receive an input signal and a feedback signal and produce an intermediate signal; and
a variable-offset circuit operable to receive the intermediate signal and produce an output signal and the feedback signal, the output signal having a DC offset that varies corresponding to a varying parameter of the variable-offset circuit, the amplifier being operable to reduce variation of the DC offset of the output signal; where
the circuit is compliant with one or more of the Institute of Electrical and Electronics Engineers; standards 802.11, 802.11a, 802.11b, 802.11e, 802.11g, 802.11h, 802.11i, 802.11n, and 802.16.

9. A circuit, comprising:
amplifying means for receiving an input signal and a feedback signal and producing an intermediate signal; and
processing means for receiving the intermediate signal and producing an output signal and the feedback signal, the output signal having a DC offset that varies corresponding to a varying parameter of the processing means, the amplifying means being operable to reduce variation of the DC offset of the output signal by a factor that corresponds to a gain of the amplifying means.

10. A circuit, comprising:
amplifying means for receiving an input signal and a feedback signal and producing an intermediate signal; and
processing means for receiving the intermediate signal and producing an output signal and the feedback signal, the output signal having a DC offset that varies corresponding to a varying parameter of the processing means, the amplifying means being operable to reduce variation of the DC offset of the output signal; and
correcting means for receiving the output signal and producing a correction signal, the correction signal being used by the processing means to reduce a magnitude of the DC offset of the output signal.

11. The circuit of claim 10, wherein: the correcting means includes,
digital signal processing means for measuring the DC offset of the output signal and producing a control signal;
and digital-to-analog conversion means for receiving the control signal and producing the correction signal.

12. The circuit of claim 10, wherein:
the correction signal is a current that is applied to the processing means.

13. The circuit of claim 10, wherein:
the correction signal is a voltage that is applied to the processing means.

14. The circuit of claim 9, wherein:
the processing means is a variable-gain amplifying means and the DC offset of the output signal varies with a gain of the variable-gain amplifying means.

15. A circuit, comprising:
amplifying means for receiving an input signal and a feedback signal and producing an intermediate signal; and
processing means for receiving the intermediate signal and producing an output signal and the feedback signal, the output signal having a DC offset that varies corresponding to a varying parameter of the processing means, the amplifying means being operable to reduce variation of the DC offset of the output signal; where
the amplifying means is a unity-gain buffering means.

16. A circuit comprising:
amplifying means for receiving an input signal and a feedback signal and producing an intermediate signal; and
processing means for receiving the intermediate signal and producing an output signal and the feedback signal, the output signal having a DC offset that varies corresponding to a varying parameter of the processing means, the amplifying means being operable to reduce variation of the DC offset of the output signal; where
the circuit is compliant with one or more of the Institute of Electrical and Electronics Engineers standards 802.11, 802.11a, 802.11b, 802.11e, 802.11g, 802.11h, 802.11i, 802.11n, and 802.16.

17. A wireless transceiver, comprising:
a receiver operable to receive a modulated carrier signal, the receiver including,
an amplifier operable to receive an input signal and a feedback signal and produce an intermediate signal; and
a variable-offset circuit operable to receive the intermediate signal and produce an output signal and the feedback signal, the output signal having a DC offset that varies corresponding to a varying parameter of the variable-offset circuit, the amplifier being operable to reduce variation of the DC offset of the output signal by a factor that corresponds to a gain of the amplifier.

18. A wireless transceiver, comprising:
a receiver operable to receive a modulated carrier signal, the receiver including,
an amplifier operable to receive an input signal and a feedback signal and produce an intermediate signal;
a variable-offset circuit operable to receive the intermediate signal and produce an output signal and the feedback signal, the output signal having a DC offset that varies corresponding to a varying parameter of the variable-offset circuit, the amplifier being operable to reduce variation of the DC offset of the output signal; and
a correction circuit operable to receive the output signal of the variable offset circuit and produce a correction signal, the correction signal being applied to the variable-offset circuit to reduce a magnitude of the DC offset of the output signal.

19. The wireless transceiver of claim 18, wherein:
the correction circuit includes:
a digital signal processor operable to measure the DC offset of the output signal and produce a control signal; and
a digital-to-analog converter operable to receive the control signal and produce the correction signal.

20. The wireless transceiver of claim 18, wherein:
the correction signal is a current that is applied to the variable-offset circuit.

21. The wireless transceiver of claim 18, wherein:
the correction signal is a voltage that is applied to the variable-offset circuit.

22. The wireless transceiver of claim 17, wherein:
the variable-offset circuit is a variable-gain amplifier circuit and the DC offset of the output signal varies with a gain of the variable-gain amplifier.

23. A wireless transceiver, comprising:
a receiver operable to receive a modulated carrier signal, the receiver including,
an amplifier operable to receive an input signal and a feedback signal and produce an intermediate signal; and
a variable-offset circuit operable to receive the intermediate signal and produce an output signal and the feed back signal, the output signal having a DC offset that varies corresponding to a varying parameter of the variable-offset circuit, the amplifier being operable to reduce variation of the DC offset of the output signal; where
the amplifier is a unity-gain buffer amplifier.

24. A wireless transceiver, comprising:
a receiver operable to receive a modulated carrier signal, the receiver including,
an amplifier operable to receive an input signal and a feedback signal and produce an intermediate signal; and
a variable-offset circuit operable to receive the intermediate signal and produce an output signal and the feed back signal, the output signal having a DC offset that varies corresponding to a varying parameter of the variable-offset circuit, the amplifier being operable to reduce variation of the DC offset of the output signal; where
the wireless transceiver is compliant with one or more of the Institute of Electrical and Electronics Engineers standards 802.11, 802.11a, 802.11b, 802.11e, 802.11g, 802.11h, 802.11i, 302.11n, and 802.16.

25. A wireless transceiver, comprising:
receiver means for receiving a modulated carrier signal, the receiver means including,
amplifying means for receiving an input signal and a feedback signal and producing an intermediate signal; and
processing means for receiving the intermediate signal and producing an output signal and the feedback signal, the output signal having a DC offset that varies corresponding to a varying parameter of the processing means, the amplifying means being operable to reduce variation of the DC offset of the output signal by a factor that corresponds to a gain of the amplifying means.

26. A wireless transceiver, comprising:
receiver means for receiving a modulated carrier signal, the receiver means including,
  amplifying means for receiving an input signal and a feedback signal and producing an intermediate signal;
  processing means for receiving the intermediate signal and producing an output signal and the feedback signal, the output signal having a DC offset that varies corresponding to a varying parameter of the processing means, the amplifying means being operable to reduce variation of the DC offset of the output signal; and
  correcting means for receiving the output signal and producing a correction signal, the correction signal being used by the processing means to reduce a magnitude of the DC offset of the output signal.

27. The wireless transceiver of claim 26, wherein:
the correcting means includes,
  digital signal processing means for measuring the DC offset of the output signal and producing a control signal;
  digital-to-analog conversion means for receiving the control signal and producing the correction signal.

28. The wireless transceiver of claim 26, wherein:
the correction signal is a current that is applied to the processing means.

29. The wireless transceiver of claim 26, wherein:
the correction signal is a voltage that is applied to the processing means.

30. The wireless transceiver of claim 25, wherein:
the processing means is a variable-gain amplifying means and the DC offset of the output signal varies with a gain of the variable-gain amplifying means.

31. A wireless transceiver, comprising:
receiver means for receiving a modulated carrier signal, the receiver means including,
  amplifying means for receiving an input signal and a feedback signal and producing an intermediate signal; and
  processing means for receiving the intermediate signal and producing an output signal and the feedback signal, the output signal having a DC offset that varies corresponding to a varying parameter of the processing means, the amplifying means being operable to reduce variation of the DC offset of the output signal; where the amplifying means is a unity-gain buffering means.

32. A wireless transceiver, comprising:
receiver means for receiving a modulated carrier signal, the receiver means including,
  amplifying means for receiving an input signal and a feedback signal and producing an intermediate signal; and
  processing means for receiving the intermediate signal and producing an output signal and the feedback signal, the output signal having a DC offset that varies corresponding to a varying parameter of the processing means, the amplifying means being operable to reduce variation of the DC offset of the output signal; where
the wireless transceiver is compliant with one or more of the Institute of Electrical and Electronics Engineers standards 802.11, 802.11a, 802.11b, 802.11e, 802.11g, 802.11h, 802.11i, 302.11n, and 802.16.

33. A method for reducing variation of a DC offset, the method comprising:
amplifying an input signal to produce an intermediate signal;
processing the intermediate signal to produce a feedback signal and an output signal, the output signal having a DC offset that varies corresponding to a varying parameter of circuitry used to process the intermediate signal; and
reducing variation of the DC offset of the output signal using the feedback signal by a factor that corresponds to a gain of the amplification.

34. A method for reducing variation of a DC offset, the method comprising:
amplifying an input signal to produce an intermediate signal;
processing the intermediate signal to produce a feedback signal and an output signal, the output signal having a DC offset that varies corresponding to a varying parameter of circuitry used to process the intermediate signal; and
reducing variation of the DC offset of the output signal using the feedback signal;
measuring the DC offset of the output signal; and
applying a correction signal to the circuitry used to process the intermediate signal to reduce a magnitude of the DC offset of the output signal.

35. The method of claim 34, wherein:
measuring the DC offset includes digitally measuring the DC offset, and
applying a correction signal includes applying an analog correction signal produced responsive to a digital control signal, the digital control signal produced responsive to the digital measurement of the DC offset.

36. The method of claim 34, wherein:
applying a correction signal includes applying a correction current.

37. The method of claim 34, wherein:
applying a correction signal includes applying a correction voltage.

38. The method of claim 33, wherein:
processing the intermediate signal includes variably amplifying the intermediate signal; and
the DC offset of the output signal varies with a variation of the variable amplification.

39. A method for reducing variation of a DC offset, the method comprising:
amplifying an input signal to produce an intermediate signal;
processing the intermediate signal to produce a feedback signal and an output signal, the output signal having a DC offset that varies corresponding to a varying parameter of circuitry used to process the intermediate signal;
reducing variation of the DC offset of the output signal using the feedback signal; and
amplifying the input signal includes buffering the input signal.

40. A method for reducing variation of a DC offset, the method comprising:
amplifying an input signal to produce an intermediate signal;
processing the intermediate signal to produce a feedback signal and an output signal, the output signal having a DC offset that varies corresponding to a varying parameter of circuitry used to process the intermediate signal;

reducing variation of the DC offset of the output signal using the feedback signal; where
the method is compliant with one or more of the Institute of Electrical and Electronics Engineers standards 802.11, 802.11a, 802.11b, 802.11e, 802.11g, 802.11h, 802.11i, 302.11n, and 802.16.

* * * * *